United States Patent [19]

Noll et al.

[11] Patent Number: 4,972,043

[45] Date of Patent: Nov. 20, 1990

[54] MULTI-LEAD HERMETIC POWER PACKAGE WITH HIGH PACKING DENSITY

[75] Inventors: Walter Noll, San Jose; Chuck Heron, Los Gatos, both of Calif.

[73] Assignee: Ixys Corporation, San Jose, Calif.

[21] Appl. No.: 304,296

[22] Filed: Jan. 30, 1989

[51] Int. Cl.$^5$ ............................................. H01L 23/04
[52] U.S. Cl. ....................................... 174/52.4; 357/74
[58] Field of Search ................... 174/52.2, 52.4; 357/74

[56] References Cited

U.S. PATENT DOCUMENTS

| | | | |
|---|---|---|---|
| 3,206,704 | 9/1965 | Hay | 174/52.2 X |
| 3,876,926 | 8/1975 | Schott et al. | 174/52.2 X |
| 4,506,108 | 3/1985 | Kersch et al. | 174/52.4 |
| 4,546,412 | 10/1985 | Nakazawa et al. | 174/52.2 X |
| 4,636,580 | 1/1987 | Neidig et al. | 174/52.2 |
| 4,713,634 | 12/1987 | Yamamura | 357/74 X |

Primary Examiner—Leo P. Picard
Assistant Examiner—David A. Tone
Attorney, Agent, or Firm—Townsend and Townsend

[57] ABSTRACT

An hermetic package for power semiconductor devices is disclosed. The package includes a generally rectangular cavity with leads extending through the walls thereof. The bottom of the cavity is defined by a base which includes a pair of mounting tabs protruding from opposite corners thereof. The mounting tabs are configured to allow the packages to be nested together. A cover attached to the walls provides a hermetically sealed package.

11 Claims, 1 Drawing Sheet

U.S. Patent    Nov. 20, 1990    4,972,043
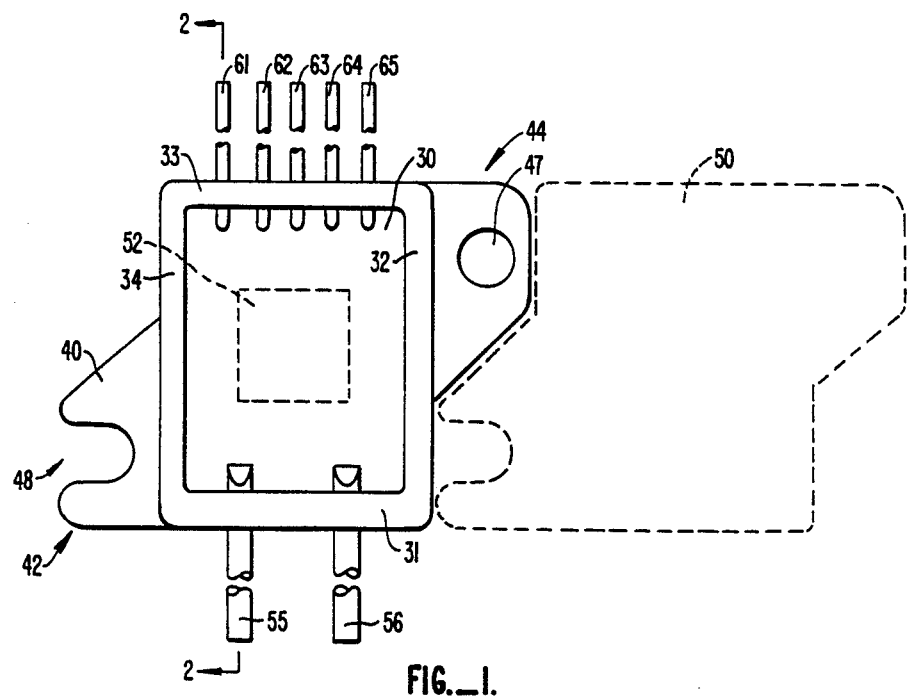
FIG._1.
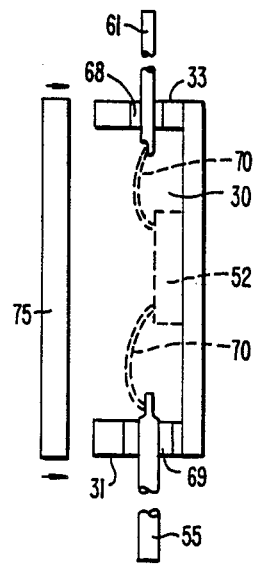
FIG._2.
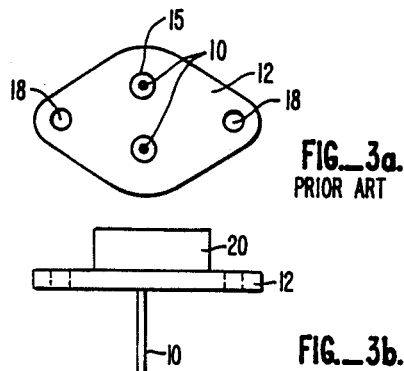
FIG._3a.
PRIOR ART
FIG._3b.
PRIOR ART

MULTI-LEAD HERMETIC POWER PACKAGE WITH HIGH PACKING DENSITY

BACKGROUND OF THE INVENTION

1. Field of the Invention

This invention relates to packages for power electronic devices, and in particular, to a multi-lead package for power semiconductor devices. The package can be hermetically sealed and has a footprint to allow high packing density, yet is compatible with conventional mounting holes for power semiconductor device packages.

2. Description of the Prior Art

To date, packaging of power semiconductor devices has typically employed packages such as the TO-204, also known as the TO-3. This hermetic package has established an industry standard spacing for mounting holes for affixing the package to a printed circuit board or other substrate. FIGS. 3a and 3b illustrate this prior art package.

Although this package has been widely used for packaging power devices for many years, it has several features which limit its performance. As shown, the leads 10 are brought out through the base 12 of the package. This considerably limits the size of the die or dice that may be attached to the base of the package, because any such die or dice must be affixed in the space between the openings 15 through which the leads pass and between the mounting holes 18. Furthermore, because holes 15 must be provided in the mounting surface, the power dissipation of the package is restricted because the surface area of the bottom of the package is reduced to allow room to contact the leads 10.

An additional disadvantage of the TO-204 package is that additional holes must be drilled in the mounting surface to attach the package to enable the leads 10 to protrude through the mounting surface. Furthermore, the package cavity 20 is cylindrical, while most die are rectangular, thereby wasting space. The nonrectangular shape of the package base does not allow efficient placement of many packages on the same mounting surface.

SUMMARY OF THE INVENTION

We have developed a package which overcomes the disadvantages of the well known TO-204 package. The package of our invention brings the leads out through the side of the package, rather than through its base. This removes the previous limit on the size of the die or dice that may be attached to the base of the package. Furthermore, because the leads are brought out through the side of the package, no additional mounting holes are necessary in the mounting surface to attach the package, beyond the conventional mounting holes. Because the package cavity in the preferred embodiment of our invention is rectangular, one or more die may be efficiently mounted within the cavity. Additionally, the Z-configuration of the package base allows efficient placement of many packages on the same mounting surface, yet employs the standard hole spacing of the prior art.

In a preferred embodiment, a package for a power semiconductor device according to our invention includes a semiconductor device mounting cavity of generally rectangular configuration, the cavity being defined by walls surrounding its periphery. A base is affixed to the semiconductor device mounting cavity and includes a spaced-apart pair of mounting regions extending from diagonally opposite corners of the walls of the cavity. The mounting regions are adapted to enable the base to be affixed to a mounting surface. The package also includes at least two leads which extend through openings in the walls of the cavity to enable electrical signals to communicate from within the cavity to outside the walls of the cavity.

BRIEF DESCRIPTION OF THE DRAWINGS

FIG. 1 is a top view of a preferred embodiment of the package of our invention, illustrating in dashed lines how more than one package may be nested together.

FIG. 2 is a cross-sectional view of the package.

FIGS. 3a and 3b are top and side views, respectively, of a prior art package.

DETAILED DESCRIPTION OF THE PREFERRED EMBODIMENTS

FIG. 1 is a top view of a preferred embodiment of the power semiconductor device package of our invention. The package includes a semiconductor device mounting cavity of generally rectangular configuration 30. Cavity 30 is defined by walls 31, 32, 33, and 34 of generally rectangular shape. In the preferred embodiment, the walls comprise a metal such as copper, copper alloys, or steel. The walls are referred to herein as forming a generally rectangular configuration in view of their rounded corners. It will be appreciated, however, that the degree of rounding of corners is arbitrary, and can be employed as much or as little as desired.

Affixed to the bottom of the walls is a base 40 which includes tabs 42 and 44. Base 40 completely encloses the bottom of cavity 30. In the preferred embodiment, base 40 comprises a highly thermally conductive material such as copper or a copper alloy, and is affixed thereto using brazing, soldering, welding or other well known technique. It should be understood, however, that base 40 could be formed integrally with the walls of the cavity to thereby provide one-piece construction.

To enable mounting of the complete package on a printed circuit board or other surface or substrate, a pair of tabs 42 and 44 project from opposite corners of the package. In the preferred embodiment, tab 44 includes an opening 47, while tab 42 includes a slot 48. For mounting of the package, bolts or other fasteners are used to secure the package through corresponding openings in the underlying substrate, printed circuit board, or other substrate. Also, in the preferred embodiment the center-to-center spacing of slot 48 and opening 47 corresponds to the center-to-center spacing of mounting holes in prior art packages such as shown in FIGS. 3a and 3b. The use of this spacing enables the package of our invention to be mounted on a substrate with conventionally-spaced openings. In the prior art packages, the preferred hole-to-hole spacing was 1.187 inches. In the package of our invention, the same hole-to-hole spacing is provided by displacing the openings 1.05 inches horizontally from each other and 0.55 inches vertically.

In FIG. 1 the mounting openings 47 and 48 in tabs 42 and 44 are shown as a slot and a hole, respectively. Of course, other openings or configurations of openings can also be employed. For example, in some embodiments two holes are used, while in other embodiments two slots are employed. The figure depicts one of each for illustrative purposes.

A further advantage of the package of our invention is the configuration of tabs 42 and 44. As shown in FIG. 1, the footprint of each tab is an inverted mirror reflections of the other tab. Thus, for example, the portion of wall 34 occupied by tab 42 corresponds to the portion of the wall 32 occupied by tab 44. In addition, the tabs taper away from the package at the same rate. This enables closer packing of numerous packages on a substrate. To illustrate this, a second package footprint 50 is shown in FIG. 1 in dashed lines. The second package illustrates how the left side of one package abuts closely with the right side of another package, thereby minimizing wasted area on the mounting surface.

In a preferred embodiment, a chip 52 will be affixed to the interior of the cavity 30 using well known techniques. Preferably, these techniques provide excellent thermal conductivity between the backside of chip 52 and the base 40, thereby enabling heat to be dissipated from the device 52 through the base and into any underlying substrate. To enable electrical connections to be made to chip 52, a series of leads extend through the walls of the package. In the preferred embodiment, a pair of power leads 55 and 56 extend through one wall 31 of the package, while a series of signal leads 61, 62, 63, 64, and 65 extend through another wall 33. The large number of leads allows substantially greater flexibility in the types of devices or circuits which can be assembled in the package. In prior art packages, typified by FIG. 3a, two leads were typical. The presence of more leads further limited package performance. Furthermore, by bringing the leads out through the sides of the package as shown in FIG. 1, more of the interior of the cavity 30 is available for mounting of semiconductor devices. This enables larger devices to be mounted, or even a plurality of devices to be mounted within the cavity. In contrast, the prior art was typically limited to at most two devices.

The power and signal leads are brought out through the sides of the package in the manner shown more clearly in FIG. 2. As shown there, openings are made in the walls, and then the leads are electrically isolated from the walls by insulating material 68 and 69. In the preferred embodiment, this insulating material comprises a high temperature ceramic material, formed in a conventional manner, known as "pin-and-eyelet" construction. The high temperature glass material enables the package to be hermetically sealed from the ambient, prevents the leads from shorting to the package walls, and provides an appropriate coefficient of expansion.

As shown in FIG. 2, once the chip 52 has been mounted within the package and suitable electrical connections 70 made between the chip and the leads, a lid 75 will be affixed to the top of the walls to hermetically enclose the chip. In the preferred embodiment, lid 75 comprises material substantially identical to the walls and is affixed to the walls using soldering, welding, or other conventional techniques.

The chip package of our invention as shown and described above has numerous advantages over prior art packages such as depicted in FIGS. 3a and 3b. By bringing the leads out through the walls of the package, much greater flexibility is afforded with respect to the size and number of the die or dice that may be mounted within the package. Elimination of the openings through the base of the package improves heat dissipation by increasing the contact surface area. Furthermore, bringing the leads out through the side of the package eliminates the need for providing additional holes in the surface to which the chip package is mounted. The configuration of the mounting tabs allows the package to be mounted on conventional substrates with already existing openings, yet enables packages to be closely nested together to more efficiently utilize the mounting surface area, while providing uniform package clamping pressure. The larger surface area of the cavity enables larger die to be mounted within it, and improves heat dissipation. Because the package allows at least seven leads, substantially greater flexibility in the devices and circuits which can be assembled in the package is provided. Furthermore, by bringing the power leads out one side of the package, while bringing the sense and control leads out the other side of the package, the amount of electrical noise on the sense and control leads is minimized.

Although the foregoing has been a description of the preferred embodiment of our invention, it should be appreciated that many modifications to the preferred embodiment may be performed without departing from the scope of the invention. The scope of the invention is set forth in the appended claims.

I claim:

1. A package for a semiconductor device comprising:
   a semiconductor device mounting cavity of generally rectangular configuration, the cavity being defined by walls surrounding its periphery;
   a base affixed to the semiconductor device mounting cavity, the base having a spaced-apart pair of mounting tabs extending from diagonally opposite corners of the walls of the cavity, the mounting tabs being adapted to enable the base to be affixed to a mounting surface, wherein the mounting tabs each extend outward from the base by an equal distance and occupy an area equal to about one-half of the area defined by the length of the base times the width of the tab; and
   at least two leads extending through openings in the walls of the cavity to enable electrical signals to communicate from within the cavity to outside the walls.

2. A package as in claim 1 wherein:
   each of the first and second tabs are tapered to become smaller further from the base.

3. A package as in claim 2 wherein:
   the first and second tabs have geometries that are inverted mirror images of each other.

4. A package as in claim 3 wherein:
   the first tab includes a mounting hole; and
   the second tab includes a mounting slot.

5. A package as in claim 1 wherein the at least two leads comprise:
   two leads extending through openings in one wall of the cavity; and
   a plurality of leads extending through an opposite wall of the cavity.

6. A package as in claim 5 wherein the two leads enable coupling the package to be source of electrical power.

7. A package as in claim 6 wherein the plurality of leads comprises five leads.

8. A package as in claim 1 wherein the cavity is defined by four walls extending upward from the base to thereby define the rectangular configuration.

9. A package as in claim 8 wherein:
   the openings in the walls for the leads are larger than the leads to define an annular region about each lead where it passes through the wall; and an electrically insulating material is disposed in the openings to electrically isolate the leads from the walls.

10. A package as in claim 1 further comprising:

a cover disposed over the cavity and affixed to the walls to enclose the cavity.

11. A package as in claim 10 wherein the cover hermetically encloses the cavity.

* * * * *